US011610724B2

(12) United States Patent
Jung et al.

(10) Patent No.: US 11,610,724 B2
(45) Date of Patent: Mar. 21, 2023

(54) COIL COMPONENT

(71) Applicant: SAMSUNG ELECTRO-MECHANICS CO., LTD., Suwon-si (KR)

(72) Inventors: Jung Hyuk Jung, Suwon-si (KR); Young Sun Kim, Suwon-si (KR); Sung Hee Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 352 days.

(21) Appl. No.: 16/884,242

(22) Filed: May 27, 2020

(65) Prior Publication Data

US 2021/0225578 A1 Jul. 22, 2021

(30) Foreign Application Priority Data

Jan. 21, 2020 (KR) ........................ 10-2020-0007999

(51) Int. Cl.
*H05K 1/16* (2006.01)
*H05K 1/18* (2006.01)
(Continued)

(52) U.S. Cl.
CPC ..... *H01F 27/2804* (2013.01); *H01F 17/0013* (2013.01); *H01F 17/04* (2013.01);
(Continued)

(58) Field of Classification Search
CPC .......... H05K 1/165; H05K 1/185; H05K 3/26; H05K 1/16; H05K 1/18; H05K 3/30;
(Continued)

(56) References Cited

U.S. PATENT DOCUMENTS

2005/0068146 A1 3/2005 Jessie
2010/0079233 A1* 4/2010 Koprivnak .......... H01F 27/2804 336/200

(Continued)

FOREIGN PATENT DOCUMENTS

JP 2017-147321 A 8/2017
KR 10-2006-0058735 A 5/2006
(Continued)

OTHER PUBLICATIONS

Korean Office Action dated Nov. 9, 2020 issued in Korean Patent Application No. 10-2020-0007999 (with English translation).

*Primary Examiner* — Xiaoliang Chen
(74) *Attorney, Agent, or Firm* — Morgan, Lewis & Bockius LLP

(57) ABSTRACT

A coil component includes a support substrate, a first coil and a second coil disposed on the support substrate to be spaced apart from each other, and a body including a first core and a second core penetrating through the first coil portion and the second coil portion and spaced apart from each other. The first coil portion has a first winding portion, forming at least one turn about the first core, and a first extension portion extending from one end portion of the first winding portion to surround the first core and the second core. The second coil has a second winding portion, forming at least one turn about the second core, and a second extension portion extending from one end portion of the second winding portion to surround the first core and the second core. A separation distance between a given turn of the first coil portion and an adjacent turn of the second coil portion is different from a separation distance between adjacent turns of the first coil portion.

10 Claims, 8 Drawing Sheets

I–I'

(51) Int. Cl.

| | |
|---|---|
| ***H05K 3/26*** | (2006.01) |
| ***H05K 3/30*** | (2006.01) |
| ***H01F 5/00*** | (2006.01) |
| ***H01F 5/04*** | (2006.01) |
| ***H01F 17/00*** | (2006.01) |
| ***H01F 17/04*** | (2006.01) |
| ***H01F 21/08*** | (2006.01) |
| ***H01F 27/26*** | (2006.01) |
| ***H01F 27/28*** | (2006.01) |
| ***H01F 27/29*** | (2006.01) |
| ***H01F 27/32*** | (2006.01) |
| ***H01F 27/38*** | (2006.01) |
| ***H01F 27/255*** | (2006.01) |

(52) U.S. Cl.
CPC ....... *H01F 27/255* (2013.01); *H01F 27/2885* (2013.01); *H01F 27/323* (2013.01)

(58) Field of Classification Search
CPC ..... H01F 3/00; H01F 5/00; H01F 5/03; H01F 5/04; H01F 5/26; H01F 17/00; H01F 17/04; H01F 17/0013; H01F 21/08; H01F 27/26; H01F 27/28; H01F 27/29; H01F 27/32; H01F 27/38; H01F 27/255; H01F 27/263; H01F 27/292; H01F 27/327; H01F 27/346; H01F 27/2804
USPC ............................ 336/192, 83, 200; 324/260
See application file for complete search history.

(56) References Cited

U.S. PATENT DOCUMENTS

| | | | | |
|---|---|---|---|---|
| 2013/0057276 | A1* | 3/2013 | Klein | H01F 5/003 336/200 |
| 2016/0078986 | A1* | 3/2016 | Yoon | H01F 3/00 336/83 |
| 2017/0372832 | A1 | 12/2017 | Choi | |
| 2018/0075965 | A1* | 3/2018 | Yoshioka | H01F 27/292 |
| 2018/0108475 | A1* | 4/2018 | Hamada | H01F 17/00 |
| 2018/0211762 | A1 | 7/2018 | Jung et al. | |
| 2018/0358166 | A1* | 12/2018 | Kubik | H01F 27/255 |
| 2021/0272735 | A1* | 9/2021 | Aikawa | H01F 27/2804 |

FOREIGN PATENT DOCUMENTS

| | | | |
|---|---|---|---|
| KR | 10-2015-0079133 | A | 7/2015 |
| KR | 10-2016-0032580 | A | 3/2016 |
| KR | 10-2018-0001021 | A | 1/2018 |
| KR | 10-2018-0086713 | A | 8/2018 |

* cited by examiner

COIL COMPONENT

CROSS-REFERENCE TO RELATED APPLICATION(S)

This application claims the benefit under 35 USC 119(a) of Korean Patent Application No. 10-2020-0007999 filed on Jan. 21, 2020 in the Korean Intellectual Property Office, the entire disclosure of which is incorporated herein by reference for all purposes.

TECHNICAL FIELD

The present disclosure relates to a coil component.

BACKGROUND

An inductor, a coil component, is a typical passive electronic component used in electronic devices, along with a resistor and a capacitor.

There is increasing demand for an array-type coil component, among coil components, to reduce a mounting area.

The array-type coil component may have a non-coupled or coupled inductor type, or a combination type thereof, depending on a coupling coefficient between a plurality of coil portions, or mutual inductance.

Many applications require a coupled inductor having a certain degree of leakage inductance while having a coupling coefficient of about 0.1 to about 0.9, rather than a non-coupled inductor, and it is necessary to control the coupling coefficient for each application.

SUMMARY

An aspect of the present disclosure is to provide an array-type coil component, a coupling coefficient of which may be easily controlled.

According to an aspect of the present disclosure, a coil component includes a support substrate, a first coil and a second coil disposed on the support substrate to be spaced apart from each other, and a body including a first core and a second core penetrating respectively through the first coil portion and the second coil portion and spaced apart from each other. The first coil portion has a first winding portion, forming at least one turn about the first core, and a first extension portion extending from one end portion of the first winding portion to surround the first core and the second core. The second coil has a second winding portion, forming at least one turn about the second core, and a second extension portion extending from one end portion of the second winding portion to surround the first core and the second core. A separation distance between a given turn of the first coil portion and an adjacent turn of the second coil portion is different from a separation distance between adjacent turns of the first coil portion.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
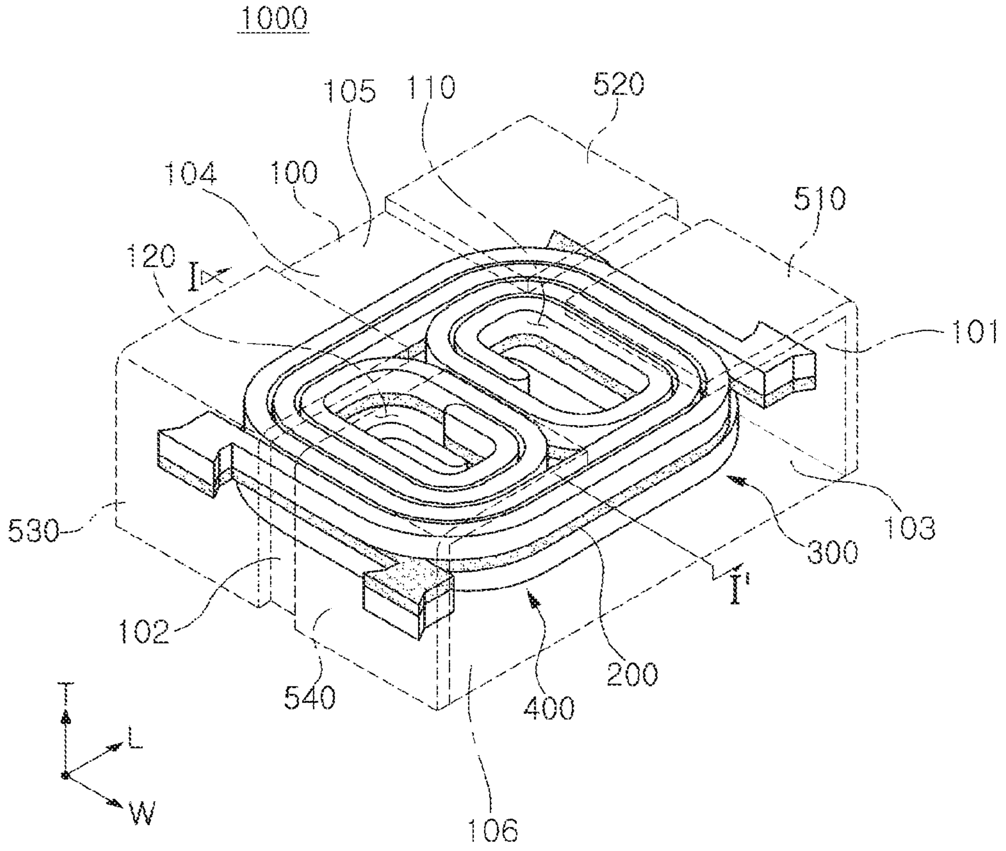
FIG. 1 is a schematic diagram of a coil component according to an example embodiment of the present disclosure.

The terms used in the description of the present disclosure are used to describe a specific embodiment, and are not intended to limit the present disclosure. A singular term includes a plural form unless otherwise indicated. The terms "include," "comprise," "is configured to," etc. of the description of the present disclosure are used to indicate the presence of features, numbers, steps, operations, elements, parts, or combination thereof, and do not exclude the possibilities of combination or addition of one or more additional features, numbers, steps, operations, elements, parts, or combination thereof. Also, the terms "disposed on," "positioned on," and the like, may indicate that an element is positioned on or beneath an object, and does not necessarily mean that the element is positioned above the object with reference to a gravity direction.

The term "coupled to," "combined to," and the like, may not only indicate that elements are directly and physically in contact with each other, but also include the configuration in which another element is interposed between the elements such that the elements are also in contact with the other component.

Sizes and thicknesses of elements illustrated in the drawings are indicated as examples for ease of description, and the present disclosure are not limited thereto.

In the drawings, an L direction is a first direction or a length (longitudinal) direction, a W direction is a second direction or a width direction, a T direction is a third direction or a thickness direction.

Hereinafter, a coil component according to an example embodiment of the present disclosure will be described in detail with reference to the accompanying drawings. Referring to the accompanying drawings, the same or corresponding components may be denoted by the same reference numerals, and overlapped descriptions will be omitted.

In electronic devices, various types of electronic components may be used, and various types of coil components may be used between the electronic components to remove noise, or for other purposes.

In other words, in electronic devices, a coil component may be used as a power inductor, a high frequency (HF) inductor, a general bead, a high frequency (GHz) bead, a common mode filter, and the like.

Figure 2:
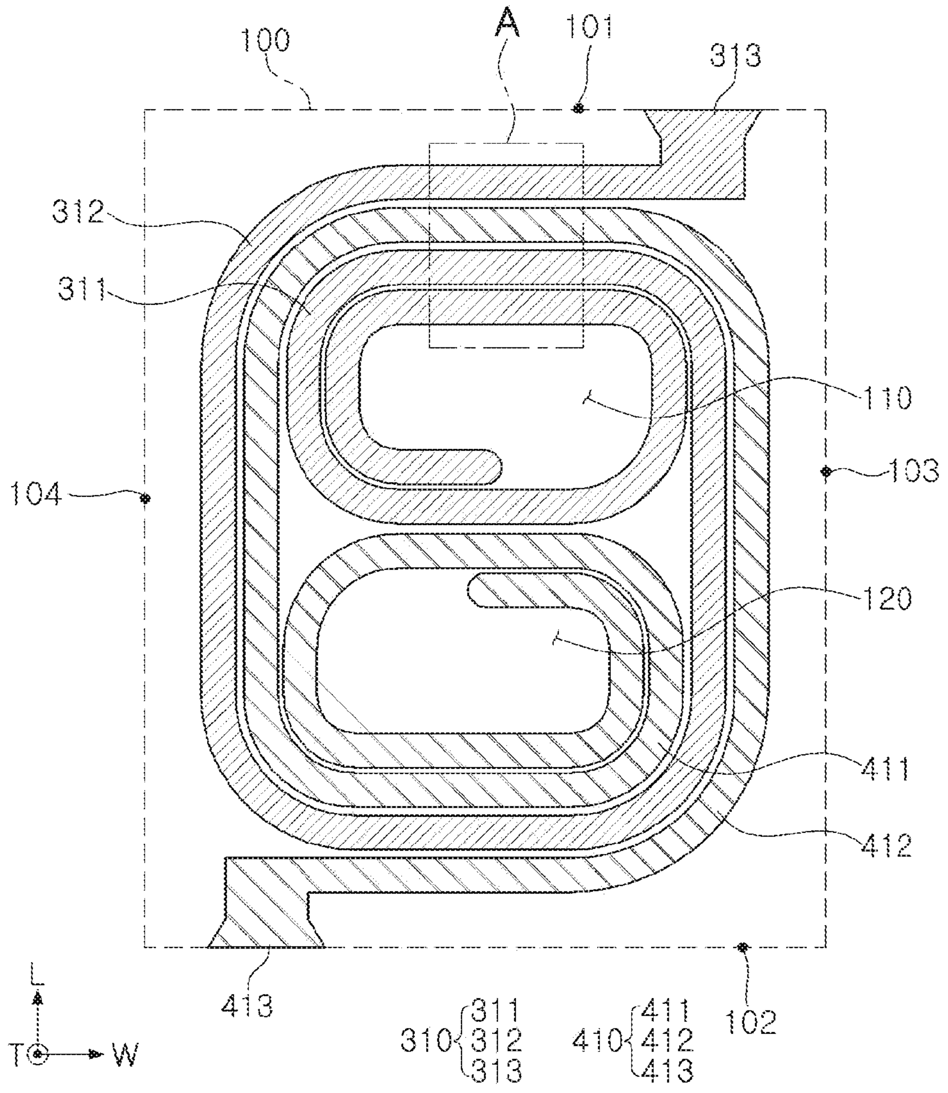
FIG. 2 illustrates an arrangement of a first coil portion and a second coil portion on a first surface of a support substrate, and is a plan view of the coil component of FIG. 1.
Figure 3:
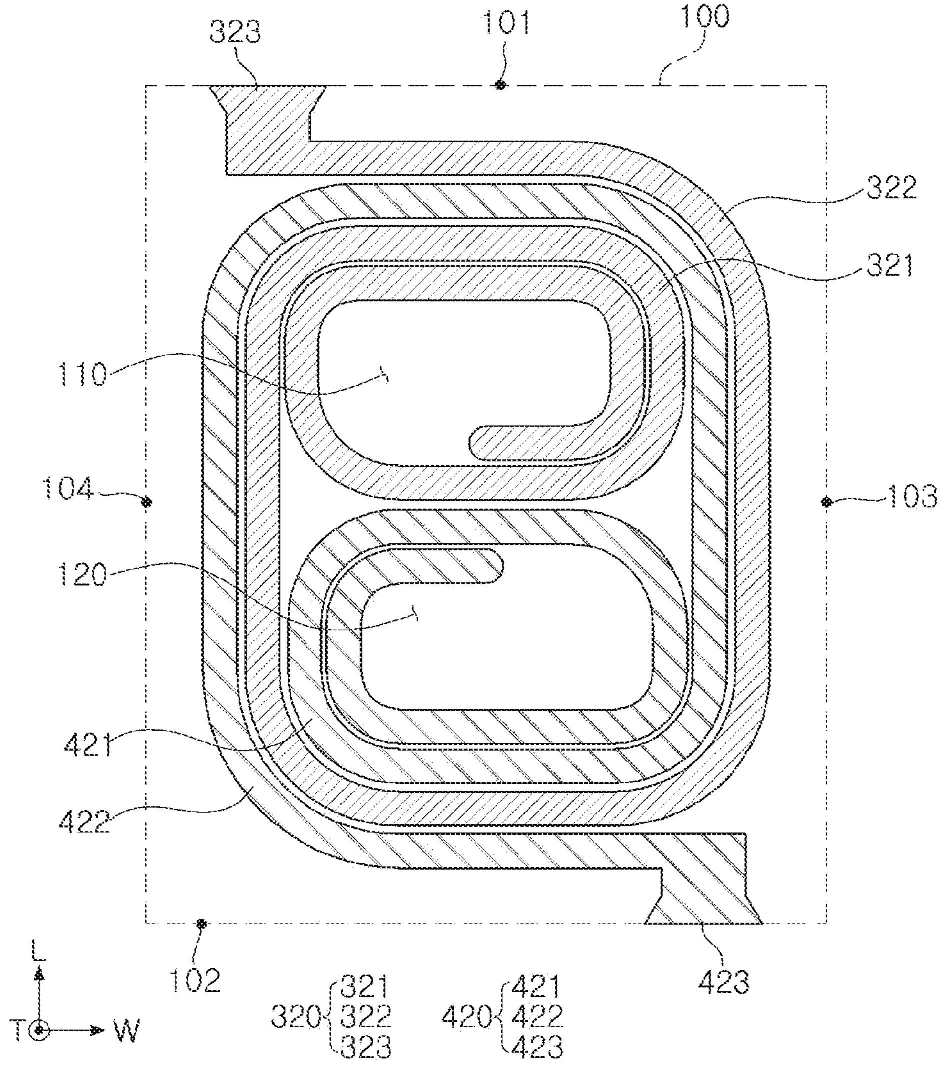
FIG. 3 illustrates an arrangement of a first coil portion and a second coil portion on a second surface of a support substrate, and is a plan view of the coil component of FIG. 1.
Figure 4:
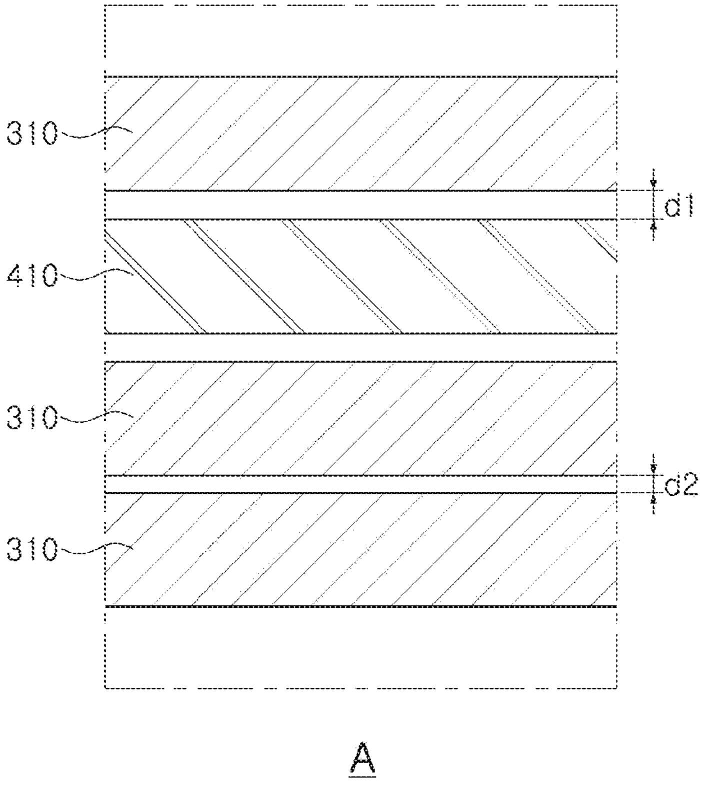
FIG. 4 is an enlarged view of portion 'A' of FIG. 2.
Figure 5:
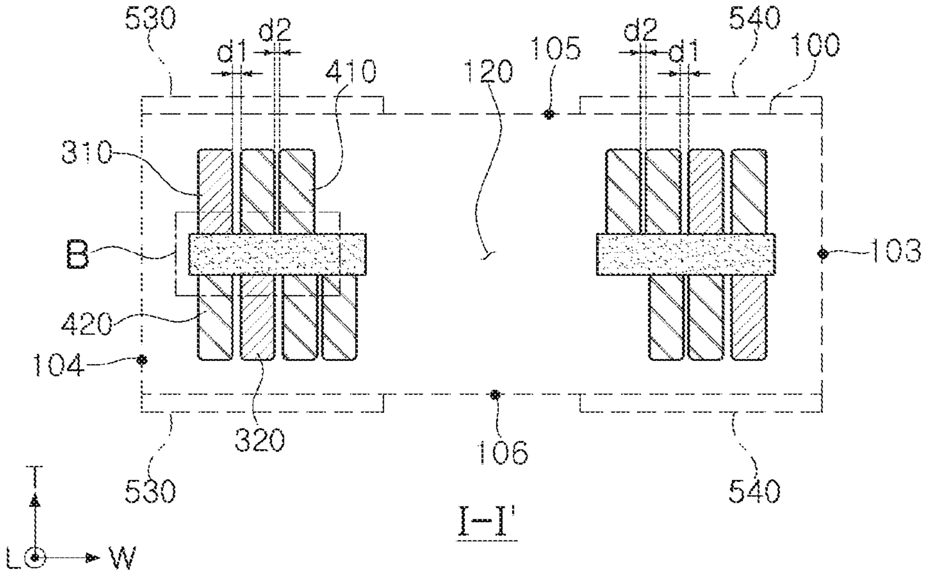
FIG. 5 is a cross-sectional view taken along line I-I' in FIG. 1.
Figure 6:
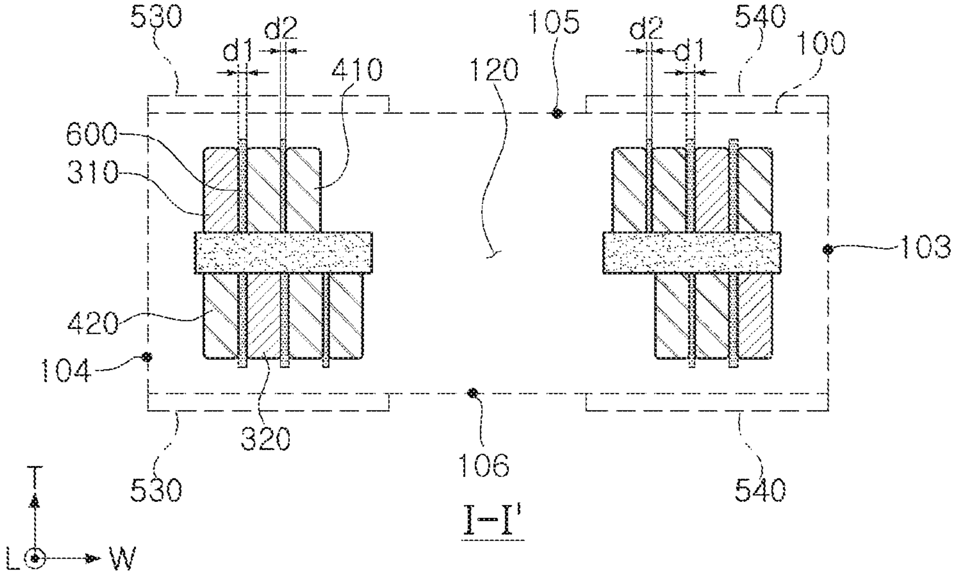
FIG. 6 illustrates a modified example of FIG. 5.
Figure 7:
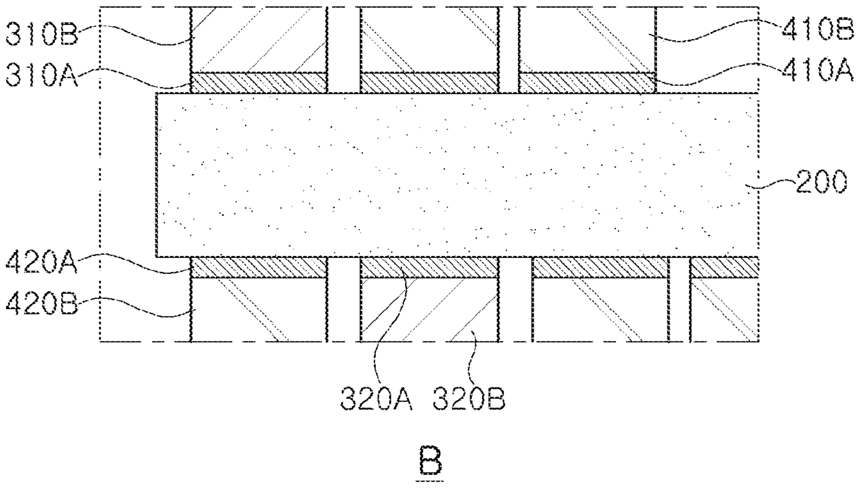
FIG. 7 is an enlarged view of portion 'B' of FIG. 5.
Figure 8:
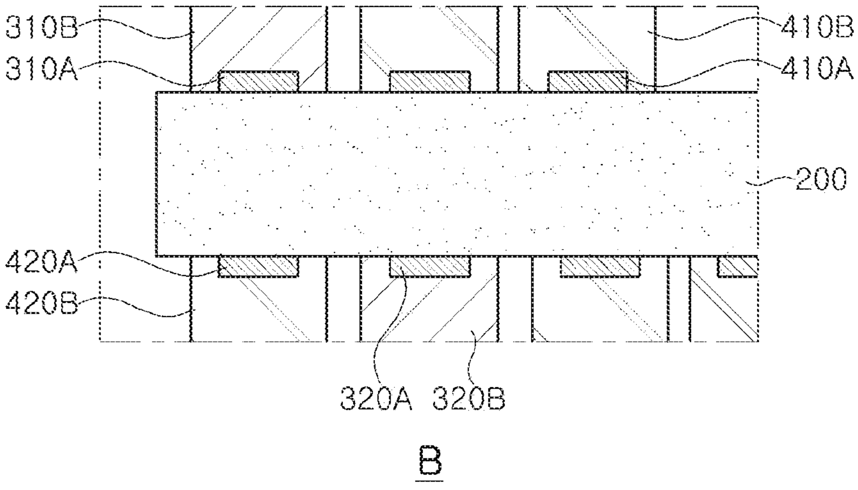
FIG. 8 illustrates a modified example of FIG. 7.

FIG. 1 is a schematic diagram of a coil component according to an example embodiment. FIG. 2 illustrates an arrangement of a first coil portion and a second coil portion on a first surface of a support substrate, and is a plan view of the coil component of FIG. 1. FIG. 3 illustrates an arrangement of a first coil portion and a second coil portion on a second surface of a support substrate, and is a plan view of the coil component of FIG. 1. FIG. 4 is an enlarged view of portion 'A' of FIG. 2. FIG. 5 is a cross-sectional view taken along line I-I' in FIG. 1. FIG. 6 illustrates a modified example of FIG. 5. FIG. 7 is an enlarged view of portion 'B' of FIG. 5. FIG. 8 illustrates a modified example of FIG. 7.

Referring to FIGS. 1 to 8, a coil component 1000 according to an example embodiment may include a body 100, a support substrate 200, a first coil portion 300, a second coil portion 400, and external electrodes 510, 520, 530, and 540, and may further include an insulating material 600.

The body 100 may form an exterior of the coil component 1000, and may embed the support substrate 200, the first coil portion 300, and the second coil portion 400 therein.

The body 100 may be formed to have a hexahedral shape overall.

Based on FIG. 1, the body 100 has a first surface 101 and a second surface 102 opposing each other in a length direction L, a third surface 103 and a fourth surface 104 opposing each other in a width direction W, and a fifth surface 105 and a sixth surface 106 opposing each other in a thickness direction T. Each of the first to fourth surfaces 101-104 of the body 100 may correspond to a wall surface of the body 100 connecting the fifth surface 105 and the sixth surface 106 of the body 100. Hereinafter, both end surfaces of the body 100 may refer to the first surface 101 and the second surface 102 of the body 100, respectively, one surface of the body 100 may refer to the sixth surface 106 of the body 100, and the other surface of the body 100 may refer to the fifth surface 105 of the body 100. In addition, hereinafter, an upper surface and a lower surface of the body 100 may refer to the fifth surface 105 and the sixth surface 106 of the body 100 defined based on a thickness direction of FIG. 1, respectively.

The body 100 may include a magnetic material and a resin. Specifically, the body 100 may be formed by laminating one or more magnetic composite sheets including a resin and a magnetic material dispersed in the resin. However, the body 100 may have a structure, other than the structure in which the magnetic material is dispersed in the resin. For example, the body 100 may be formed of a magnetic material such as ferrite.

The magnetic material may be ferrite or magnetic metal powder particles.

Examples of the ferrite powder particles may be at least one or more of spinel type ferrites such as Mg—Zn-based ferrite, Mn—Zn-based ferrite, Mn—Mg-based ferrite, Cu—Zn-based ferrite, Mg—Mn—Sr-based ferrite, Ni—Zn-based ferrite, and the like, hexagonal ferrites such as Ba—Zn-based ferrite, Ba—Mg-based ferrite, Ba—Ni-based ferrite, Ba—Co-based ferrite, Ba—Ni—Co-based ferrite, and the like, garnet type ferrites such as Y-based ferrite, and the like, and Li-based ferrites.

The magnetic metal powder particle may include one or more selected from the group consisting of iron (Fe), silicon (Si), chromium (Cr), cobalt (Co), molybdenum (Mo), aluminum (Al), niobium (Nb), copper (Cu), and nickel (Ni). For example, the magnetic metal powder particle may be at least one or more of a pure iron powder, a Fe—Si-based alloy powder, a Fe—Si—Al-based alloy powder, a Fe—Ni-based alloy powder, a Fe—Ni—Mo-based alloy powder, a Fe—Ni—Mo—Cu-based alloy powder, a Fe—Co-based alloy powder, a Fe—Ni—Co-based alloy powder, a Fe—Cr-based alloy powder, a Fe—Cr—Si-based alloy powder, a Fe—Si—Cu—Nb-based alloy powder, a Fe—Ni—Cr-based alloy powder, and a Fe—Cr—Al-based alloy powder.

The magnetic metal powder particle may be amorphous or crystalline. For example, the magnetic metal powder particle may be a Fe—Si—B—Cr-based amorphous alloy powder, but is not limited thereto.

Each of the magnetic metal powder particles may have an average diameter of about 0.1 μm to about 30 μm, but is not limited thereto.

The body 100 may include two or more types of magnetic powder particles dispersed in an insulating resin. In this case, the term "different types of magnetic powder particle" means that the magnetic powder particles, dispersed in the insulating resin, are distinguished from each other by diameter, composition, crystallinity, and shape.

The insulating resin may include an epoxy, a polyimide, a liquid crystal polymer, or the like, in a single form or in combined forms, but is not limited thereto.

The body 100 may include a first core 110, penetrating through the support substrate 200 and the first coil portion 300, and a second core 120 penetrating through the support substrate 200 and the second coil portion 400. The first and second cores 110 and 120 may be formed by filling through-holes of the support substrate 200 with at least a portion of the magnetic composite sheet in processes of laminating and curing the magnetic composite sheet, but a method of forming the core 110 is not limited thereto.

The support substrate 200 may be embedded in the body 100. The support substrate 200 may support the coil portions 300 and 400 to be described later.

The support substrate 200 may include an insulating material, for example, a thermosetting insulating resin such as an epoxy resin, a thermoplastic insulating resin such as polyimide, or a photosensitive insulating resin, or the support substrate 200 may include an insulating material in which a reinforcing material such as a glass fiber or an inorganic filler is impregnated with an insulating resin. For example, the support substrate 200 may include an insulating material such as prepreg, Ajinomoto Build-up Film (ABF), FR-4, a bismaleimide triazine (BT) film, a photo-imageable dielectric (PID) film, and the like, but are not limited thereto.

The inorganic filler may be at least one or more selected from the group consisting of silica ($SiO_2$), alumina ($Al_2O_3$), silicon carbide (SiC), barium sulfate ($BaSO_4$), talc, mud, a mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$).

When the support substrate 200 is formed of an insulating material including a reinforcing material, the support substrate 200 may provide better rigidity. When the support substrate 200 is formed of an insulating material not containing glass fibers, the support substrate 200 may be advantageous in thinning the overall component. When the support substrate 200 is formed of an insulating material containing a photosensitive insulating resin, the number of processes of forming the coil portion 300 may be reduced. Therefore, it may be advantageous in reducing production costs and advantageous in forming a via.

The first and second coil portions 300 are spaced apart from each other on the support substrate 200 to exhibit characteristics of the coil component 1000. For example, the coil component 1000 may be a coupled inductor having a coupling coefficient k between the first and second coil portions 300 and 400, which is in a range from 0 to 1, but is not limited thereto.

The first coil portion 300 has first winding portions 311 and 321 forming at least one turn about the first core 110, extension portions 312 and 322 extending from end portions of the first winding portions 311 and 321 to surround the first and second cores 110 and 120, and first lead-out portions

313 and 323 extending from the first extension portions 312 and 322 to be spaced apart from each other and to be exposed to one end surface of the body 110. The second coil portion 400 has second winding portions 411 and 421 forming at least one turn about the second core 120, second extension portions 412 and 422 extending from end portions of the second winding portions 411 and 421 to surround the first and second cores 110 and 120, and second lead-out portions 413 and 423 extending from the second extension portions 412 and 422 to be spaced apart from each other and to be exposed to the other surface of the body 100.

Specifically, referring to FIGS. 1 to 3, the first coil portion 300 includes a first upper coil pattern 310 disposed on an upper surface of the support substrate 200, a first lower coil pattern 320 disposed on a lower surface of the support substrate 200, and a first via connecting the first upper coil pattern 310 and the first lower coil pattern 320 to each other through the support substrate 200. The first upper coil pattern 310 has a first upper winding portion 311 forming at least one turn about the first core 110, a first upper extension portion 312 extending from one end portion of the first upper winding portion 311 to surround the first and second cores 110 and 120 and having an end portion disposed to be closer to one end surface of the body 110 than an outermost turn of the first upper winding portion 311, and a first upper lead-out portion 313 extending from the first upper extension portion 312 to be exposed to one end surface of the body 100. The first lower coil pattern 320 has a first lower winding portion 321 forming at least one turn about the first core 110, a first lower extension portion 322 extending from one end portion of the first lower winding portion 321 to surround the first and second cores 110 and 120 and having an end portion disposed to be closer to one end surface of the body 100 than an outermost turn of the first lower winding portion 321, and a first lower lead-out portion 323 extending from the first lower extension portion 322 to be exposed to one end surface of the body 100. The other end portion of the first upper winding portion 311 and the other end portion of the first lower winding portion 321 are each in contact with and connected to the first via, and the first upper lead-out portion 313 and the first lower lead-out portion 323 are spaced apart from each other to be exposed to one end surface of the body 100. First and second external electrodes 510 and 520 to be described later are disposed on one end surface of the body 100 to be spaced apart from each other and are respectively connected to the first upper lead-out portion 313 and the first lower lead-out portion 323. Accordingly, the first coil portion 300 may serve as a single coil in a form extending from the first upper lead-out portion 313 to the first lower lead-out portion 323.

Specifically, referring to FIGS. 1 to 3, the second coil portion 400 includes a second upper coil pattern 410 disposed on an upper surface of the support substrate 200, a second lower coil pattern 420 disposed on a lower surface of the support substrate 200, and a second via connecting the second upper coil pattern 410 and the second lower coil pattern 320 to each other through the support substrate 200. The second upper coil pattern 410 has a second upper winding portion 411 forming at least one turn about the second core 110, a second upper extension portion 412 extending from one end portion of the second upper winding portion 411 to surround the second and second cores 110 and 120 and having an end portion disposed to be closer to one end surface of the body 110 than an outermost turn of the second upper winding portion 411, and a second upper lead-out portion 413 extending from the second upper extension portion 412 to be exposed to one end surface of the body 100. The second lower coil pattern 420 has a second lower winding portion 421 forming at least one turn about the second core 110, a second lower extension portion 422 extending from one end portion of the second lower winding portion 421 to surround the second and second cores 110 and 120 and having an end portion disposed to be closer to the other end surface of the body 100 than an outermost turn of the second lower winding portion 421, and a second lower lead-out portion 423 extending from the second lower extension portion 322 to be exposed to the other end surface of the body 100. The other end portion of the second upper winding portion 411 and the other end portion of the second lower winding portion 421 are each in contact with and connected to the second via, and the second upper lead-out portion 313 and the second lower lead-out portion 423 are spaced apart from each other to be exposed to the other end surface of the body 100. Third and fourth external electrodes 530 and 540 to be described later are disposed on one end surface of the body 100 to be spaced apart from each other and are respectively connected to the second upper lead-out portion 413 and the second lower lead-out portion 423. Accordingly, the second coil portion 400 may serve as a single coil in a form extending from the second upper lead-out portion 413 to the second lower lead-out portion 423.

Referring to FIGS. 1 to 3, based on a center of the length direction L of the body 100, the second extension portions 412 and 422 of the second coil portion 400 are disposed between outermost turns of the first winding portions 311 and 321 and the first extension portions 312 and 322 on a side of the one end surface of the body 100. Similarly, the first extension portions 312 and 322 of the first coil portion 300 are disposed between outermost turns of the second winding portions 411 and 421 and the second extension portions 412 and 422 on a side of the other end surface of the body 100. For example, the first and second coil portions 300 and 400 may be disposed to have a structure in which turns are alternately disposed, and thus, electromagnetic coupling between the first and second coil portions 300 and 400 may be easily performed.

A separation distance d1 between any one turn of the first coil portion 300 and a turn of the second coil portion 400 adjacent to the first coil portion 300 may be different from a separation distance d2 between turns of the first coil portion 300 adjacent to each other. For example, referring to area A of FIG. 2 and FIG. 4, an intermediate turn of the first upper winding portion 311 adjacent to an outermost turn of the first winding portion 311, the outermost turn of the first winding portion 311, the second upper extension portion 412 of the second upper coil pattern 410, and the first upper extension portion 411 of the second upper coil pattern 410 are sequentially disposed in a direction from the center of the length direction L of the body 100 toward one end surface of the body 100. The separation distance d1 between the outermost turn of the first upper winding portion 311 and the second upper extension portion 412 of the second upper coil pattern 410, corresponding to different coils to each other, may be greater than a separation distance d2 between the outermost turn of the first upper winding portion 311, corresponding to the first coil portion 300, and the intermediate turn of the adjacent first upper winding portion 311. The separation distance d1 between the first coil portion 300 and the second coil portion 400 may be set to be different from the separation distance d2 between adjacent turns of the first coil portion 300 to easily control the coupling coefficient k. In this embodiment, unlike what is illustrated in FIGS. 4 and 5, the separation distance d1 between the first coil portion 300 and the second coil portion 400 may be shorter than the separation distance d2 between the adjacent turns of the first coil portion 300, depending on an applied application.

The separation distance d2 between the turns of the first coil portions 300 adjacent to each other may be the same as a separation distance between turns of the second coil portions 400 adjacent to each other. The separation distance d1 between the turns of the first coil portion 300 may be set to be the same as the distance d2 between the turns of the second coil portion 400 to easily control the coupling coefficient k using only the distance d1 as a variable.

Each of the first and second coil portions 300 may include a first conductive layer, disposed to be in contact with the support substrate 200, and a second conductive layer disposed on the first conductive layer and exposing a side surface of the first conductive layer. Specifically, referring to FIG. 7, based on a direction of FIG. 7, the first upper coil pattern 310 and the first lower coil pattern 320 of the first coil portion 300 include first conductive layers 310A and 320A, formed to be in contact with an upper surface and a lower surface of the support substrate 200, and second conductive layers 310B and 320B disposed on the first conductive layers 310A and 320A and exposing side surfaces of the first conductive layers 310A and 320A, respectively. The second upper coil pattern 410 and the second lower coil pattern 420 of the second coil portion 400 includes first conductive layers 410A and 420A, formed to be in contact with the upper surface and the lower surface of the support substrate 200, and second conductive layers 410B and 420B disposed on the first conductive layers 410A and 420A and exposing side surfaces of the first conductive layers 410A and 420A, respectively. The first conductive layers 310A, 320A, 410A, and 420A may be seed layers for plating and forming the second conductive layers 310B, 320B, 410B, and 420B on the support substrate 200. In FIG. 7, the first and second coil portions 300 and 400 may be formed by respectively forming seed layers for forming a first conductive layer on both surfaces of the support substrate 200, respectively forming plating resists for forming first and second coil portions on the seed layers, forming second conductive layers 310B, 320B, 410B, and 420B in openings of the plating resists for forming the first and second coil portions by plating, removing the plating resists for forming the first and second coil portions, and the seed layers exposed to an external entity. As a result of the above process, the second conductive layers 310B, 320B, 410B, and 420B may be formed in such a manner that they do not cover side surfaces of the first conductive layers 310A, 320A, 410A, and 420A.

Each of the first and second coil portions 300 and 400 may include a first conductive layer, disposed to be in contact with the support substrate 200, and a second conductive layer covering a side surface of the first conductive layer to be in contact with the support substrate 200. Specifically, referring to FIG. 8, based on a direction of FIG. 8, the first upper coil pattern 310 and the first lower coil pattern 320 of the first coil portion 300 include first conductive layers 310A and 320A, formed to be in contact with an upper surface and a lower surface of the support substrate 200, and second conductive layers 310B and 320B disposed on the first conductive layers 310A and 320A and covering side surfaces of the first conductive layers 310A and 320A to be in contact with the support substrate 200, respectively. The second upper coil pattern 410 and the second lower coil pattern 420 of the second coil portion 400 includes first conductive layers 410A and 420A, formed to be in contact with the upper surface and the lower surface of the support substrate 200, and second conductive layers 410B and 420B disposed on the first conductive layers 410A and 420A and covering side surfaces of the first conductive layers 410A and 420A to be in contact with the support substrate 200, respectively. The first conductive layers 410A, 420A, 410A, and 420A may be seed layers for plating and forming the second conductive layers 410B, 420B, 410B, and 420B on the support substrate 200. In FIG. 8, the first and second coil portions 300 and 400 may be formed by respectively forming first conductive layers 310A, 320A, 410A, and 420A corresponding to shapes of the coil patterns 310, 320, 410, and 420 on both surfaces of the support substrate 200, forming plating resists in separation spaces between turns of the first conductive layers 310A, 320A, 410A, and 420A, forming second conductive layers 310B, 320B, 410B, and 420B in openings of the plating resists by plating, and removing the plating resists. In the above-described example, a description has been given under the assumption that plating resists are used when the second conductive layer 310B, 320B, 410B, and 420B are formed. However, in the case of an anisotropic plating method, the second conductive layer 310B, 320B, 410B, and 420B may be formed without using a plating resist.

Since the first conductive layer 310A, 320A, 410A, and 420A are seed layers for forming the second conductive layer 310B, 320B, 410B, and 420B by electroplating, the first conductive layer 310A, 320A, 410A and 420A are formed to have relatively smaller thickness than the second conductive layers 310B, 320B, 410B, and 420B. The first conductive layers 310A, 320A, 410A, and 420A may be formed by a thin-film process, such as sputtering, or an electroless plating process. When the first conductive layers 310A, 320A, 410A, 420A are formed by a thin-film process such as sputtering, at least a portion of materials constituting the first conductive layers 310A, 320A, 410A, and 420A may penetrate through the surface of the support substrate 200. This may be confirmed by the fact that a difference in concentration of metal materials, constituting the first conductive layers 310A, 320A, 410A, and 420A, in the support substrate occurs in a thickness direction T of the body 100.

Each of the first conductive layers 310A, 320A, 410A, and 420A may have a thickness of 1.5 μm or more to 3 μm or less. When each of the first conductive layers 310A, 320A, 410A, and 420A has a thickness less than 1.5 μm, it may be difficult to implement the first conductive layers 310A, 320A, 410A, and 420A, and poor plating may occur in a subsequent process. When each of the first conductive layers 310A, 320A, 410A, and 420A has a thickness greater than 3 μm, it may be difficult for each of the second conductive layers 310B, 320B, 410B, and 420B to have a relatively large volume within a limited volume of the body 100.

The via may include at least one conductive layer. For example, when the via is formed by electroplating, the via may include a seed layer, formed on an internal wall of a via hole penetrating through the support substrate 200, and an electroplating layer filling the via hole in which the seed layer is formed. The seed layer of via and the first conductive layers 310A, 320A, 410A, 420A may be formed in the same process to be integrated with each other, or may be formed in different processes to form boundaries therebetween. An electroplating layer of the via and the second conductive layers 310B, 320B, 410B, and 420B may be formed in the same process to be integrated with each other, or may be formed in different processes to form boundaries therebetween.

When each of the coil patterns 310, 320, 410, and 420 has a significantly large linewidth, a volume of a magnetic material in the same body 100 may be reduced to have an adverse effect on inductance. As a non-limiting example, a ratio of a thickness to a width of each turn of the coil patterns 310, 320, 410, and 420, based on a cross section in a width-thickness (W-T) direction, for example, an aspect ratio (AR) may be 3:1 to 9:1.

Each of the coil patterns 310, 320, 410, 420 and the via may be formed of a conductive layer such as copper (Cu), aluminum (Al), silver (Ag), tin (Sn), gold (Au), nickel (Ni), lead (Pb), titanium (Ti), chromium (Cr), or alloys thereof, but a material thereof is not limited thereto. As one non-limiting example, when the first conductive layers 310A, 320A, 410A, and 420A are formed by sputtering and the second conductive layers 310B, 320B, 410B, and 420B are formed by electroplating, the first conductive layers 310A, 320A, 410A, and 420A include at least one of molybdenum (Mo), chromium (Cr), copper (Cu), and titanium (Ti), and the second conductive layers 310B, 320B, 410B, and 420B may include copper (Cu). As another non-limiting example, when the first conductive layer 310A, 320A, 410A, and 420A are formed by electroless plating and the second conductive layers 310B, 320B, 410B, and 420B are formed by electroplating, each of the first conductive layers 310A, 320A, 410A, and 420A and the second conductive layers 310B, 320B, 410B, and 420B may include copper (Cu). In this case, density of copper (Cu) in the first conductive layers 310A, 320A, 410A, and 420A may be lower than density of copper (Cu) in the second conductive layers 310B, 320B, 410B, and 420B.

The first and second external electrodes 510 and 520 are spaced apart from each other on one end surface of the body 100 to be connected to the first coil portion 300. The third and fourth external electrodes 530 and 540 are spaced apart from each other on the other end surface of the body 100 to be connected to the second coil portion 400. Specifically, the first upper lead-out portion 313 and the first lower lead-out portion 323 of the first coil portion 300, exposed to the one end surface of the body 100 to be spaced apart from each other, are in contact with and connected to the first and second external electrodes 510 and 520. The second upper lead-out portion 413 and the second lower lead-out portion 423 of the second coil portion 400, exposed to the other end surface of the body 100 to be spaced apart from each other, are in contact with and connected to the third and fourth external electrodes 530 and 540.

Each of the external electrodes 510, 520, 530, and 540 may be formed of a conductive layer such as copper (Cu), aluminum (Al), silver (Ag), tin (Sn), gold (Au), nickel (Ni), lead (Pb), titanium (Ti), or alloys thereof, but a material thereof is not limited thereto.

The external electrodes 510, 520, 530, and 540 may be formed to have a single-layer structure or a multilayer structure. As an example, the first external electrode 510 includes a first layer including copper, a second layer including nickel disposed on the first layer and including nickel (Ni), and a third layer disposed on the second layer and including tin (Sn). Each of the first to third layers may be formed by plating, but a forming method thereof is not limited thereto. As another example, the first external electrode 510 may include a resin electrode layer, including conductive powder particles and a resin, and a plating layer plated on the resin electrode layer. In this case, the resin electrode layer may include at least one conductive powder particle of copper (Cu) and silver (Ag) and a cured material of a thermosetting resin. In addition, the plating layer may include a first plating layer, including nickel (Ni), and a second plating layer including tin (Sn). When the resin included in the resin electrode layer includes the same resin as the insulating resin of the body 100, the bonding force between the resin electrode layer and the body 100 may be improved.

Referring to FIG. 6, in the case of a modified example according to this embodiment, an insulating pattern 600 may be further provided between adjacent turns of the coil patterns 310, 320, 410, and 420. In this case, an insulating material 600 disposed between a given turn of the first coil portion 300 and an adjacent turn of the second coil portion 400 may have a thickness d1 different from a thickness d2 of an insulating material disposed between adjacent turns of the first coil portion 300. In this modified example, the thickness d1 of the insulating material 600 disposed between the first coil portion 300 and the second coil portion 400 and the thickness d2 of the insulating material 600 disposed between adjacent turns of the first coil portion 300 are set to be different from each other, and thus, a coupling coefficient k is controlled. In FIG. 6, the thickness d1 of the insulating material 600 disposed between the first coil portion 300 and the second coil portion 400 is illustrated as being greater than the thickness d2 of the insulating material 600 disposed between adjacent turns of the first coil portion 300, but the scope of the present disclosure is not limited thereto. The insulating material 600 may be a permanent resist, remaining in an end product, in which the above-described plating resist for forming the second conductive layer is not removed. However, the scope of the present disclosure is not limited thereto, and the insulating material 600 may be formed by laminating an insulating film on the support substrate 200 to cover the first and second coil portions 300 and 400 after removing the plating resist.

As described above, in an array-type coil component, a coupling coefficient may be easily controlled.

While example embodiments have been shown and described above, it will be apparent to those skilled in the art that modifications and variations could be made without departing from the scope of the present disclosure as defined by the appended claims.

What is claimed is:

1. A coil component comprising:

a support substrate having a first surface;

a first coil portion and a second coil portion disposed directly on the first surface of the support substrate to be spaced apart from each other; and a body including a first core and a second core penetrating through the first coil portion and the second coil portion and spaced apart from each other, wherein the first coil portion comprises a first winding portion, forming at least one turn about the first core, and a first extension portion extending from one end portion of the first winding portion to surround the first core and the second core, the second coil portion has a second winding portion, forming at least one turn about the second core, and a second extension portion extending from one end portion of the second winding portion to surround the first core and the second core, and a separation distance between a first turn of the first coil portion and a second turn of the second coil portion that is adjacent to the first turn of the first coil portion is different from a separation distance between turns of the first coil portion that are adjacent to each other.

2. The coil component of claim 1, wherein the separation distance between the first turn of the first coil portion and the second turn of the second coil portion adjacent to the first turn of the first coil portion is greater than the separation distance between the adjacent turns of the first coil portion.

3. The coil component of claim 1, wherein the separation distance between the adjacent turns of the first coil portion is the same as a separation distance between the adjacent turns of the second coil portion.

4. The coil component of claim 1, further comprising:

an insulating material disposed between the first coil portion and the second coil portion, between the adjacent turns of the first coil portion, and between turns of the second coil portion, wherein the insulating material disposed between the first coil portion and the second coil portion has a thickness greater than a thickness of the insulating material disposed between the adjacent turns of the first coil portion.

5. The coil component of claim 4, wherein the insulating material disposed between the adjacent turns of the first coil portion has the same thickness as the insulating material disposed between the adjacent turns of the second coil portion.

6. The coil component of claim 1, wherein each of the first coil portion and the second coil portion includes a first conductive layer, disposed to be in contact with the support substrate, and a second conductive layer disposed on the first conductive layer and exposing a side surface of the first conductive layer.

7. The coil component of claim 1, wherein each of the first coil portion and the second coil portion includes a first conductive layer, disposed to be in contact with the support substrate, and a second conductive layer disposed on the first conductive layer and covering a side surface of the first conductive layer to be in contact with the support substrate.

8. The coil component of claim 1, wherein the body has one end surface and the other end surface, opposing each other, in a cross-section parallel to the first surface of the support substrate, the first winding portion is disposed to be closer to the one end surface of the body than the second winding portion, and one end portion of the first extension portion is disposed to be closer to the one end surface of the body than an outermost turn of the first winding portion.

9. The coil component of claim 1, wherein the first coil portion includes a first upper coil pattern disposed on the first surface of the support substrate, a first lower coil pattern disposed on a second surface of the support substrate, opposing the first surface of the support substrate, and a first via penetrating the support substrate to connect the first upper coil pattern and the first lower coil pattern to each other, the second coil portion includes a second upper coil pattern disposed on the first surface of the support substrate to be spaced apart from the first upper coil pattern, a second lower coil pattern disposed on the second surface of the support substrate to be spaced apart from the first lower coil pattern, and a second via penetrating the support substrate to connect the second upper coil pattern and the second lower coil pattern to each other, the first winding portion and the first extension portion are formed in the first upper coil pattern and the first lower coil pattern, respectively, and the second winding portion and the second extension portion are formed in the second upper coil pattern and the second lower coil pattern, respectively.

10. The coil component of claim 1, further comprising:

first and second external electrodes disposed on one end surface of the body to be spaced apart from each other; and third and fourth external electrodes disposed on the other end surface of the body, opposing the one end surface of the body, to be spaced apart from each other, wherein both end portions of the first coil portion are exposed to the one end surface of the body to be spaced apart from each other and to be connected to the first and second external electrodes, and both end portions of the second coil portion are exposed to the other end surface of the body to be spaced apart from each other and to be connected to the third and fourth external electrodes.

* * * * *